(12) United States Patent
Shanware et al.

(10) Patent No.: US 7,750,400 B2
(45) Date of Patent: Jul. 6, 2010

(54) INTEGRATED CIRCUIT MODELING, DESIGN, AND FABRICATION BASED ON DEGRADATION MECHANISMS

(75) Inventors: Ajit Shanware, Plano, TX (US); Srikanth Krishnan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 12/192,850

(22) Filed: Aug. 15, 2008

(65) Prior Publication Data

US 2010/0038683 A1    Feb. 18, 2010

(51) Int. Cl.
    *H01L 21/00* (2006.01)
(52) U.S. Cl. ............ 257/335; 257/288; 257/357; 257/369; 257/392; 257/623; 257/E21.531; 257/E27.007; 257/E27.011; 257/E27.064; 438/15; 438/17; 324/763; 324/765; 324/769
(58) Field of Classification Search ......... 257/288, 257/335–369, 392, 623, E21.531, E27.007, 257/E27.011, E27.064; 438/15–18; 324/763–769
See application file for complete search history.

(56) References Cited

U.S. PATENT DOCUMENTS

| | | | |
|---|---|---|---|
| 5,517,049 A * | 5/1996 | Huang | 257/357 |
| 6,380,014 B1 * | 4/2002 | Ohta et al. | 438/197 |
| 6,521,469 B1 * | 2/2003 | La Rosa et al. | 438/17 |
| 6,569,742 B1 * | 5/2003 | Taniguchi et al. | 438/303 |
| 6,635,935 B2 * | 10/2003 | Makino | 257/369 |
| 6,815,970 B2 | 11/2004 | Rost et al. | |
| 6,876,208 B2 * | 4/2005 | Kunikiyo et al. | 324/658 |
| 6,933,731 B2 | 8/2005 | Reddy et al. | |
| 7,078,937 B2 * | 7/2006 | Baude et al. | 326/112 |
| 7,157,782 B1 * | 1/2007 | Shih et al. | 257/530 |
| 7,240,308 B2 | 7/2007 | Usui | |
| 2003/0042926 A1 * | 3/2003 | Rost et al. | 324/765 |
| 2004/0262681 A1 * | 12/2004 | Masuoka et al. | 257/335 |
| 2007/0120156 A1 * | 5/2007 | Liu et al. | 257/288 |
| 2008/0027700 A1 | 1/2008 | Kinoshita et al. | |
| 2008/0114568 A1 * | 5/2008 | Marshall | 702/182 |
| 2008/0116455 A1 * | 5/2008 | Jain et al. | 257/48 |
| 2009/0167336 A1 * | 7/2009 | La Rosa et al. | 324/763 |

* cited by examiner

*Primary Examiner*—Michael S Lebentritt
(74) *Attorney, Agent, or Firm*—Rose Alyssa Keagy; W. James Brady; Frederick J. Telecky, Jr.

(57) ABSTRACT

An integrated circuit (IC) includes at least a first complementary MOS (CMOS) circuit, the first CMOS circuit comprising one or more first n-channel MOS (NMOS) transistors and one or more first p-channel MOS (PMOS) transistors, where the first NMOS transistors and the first PMOS transistors are arranged in the first CMOS circuit to drive at least a first common node of the first CMOS circuit. An average of the effective gate channel lengths of the first NMOS transistors (first NMOS average length) is at least 2% greater than an average of the effective gate channel lengths of the first PMOS transistors (first PMOS average length).

30 Claims, 5 Drawing Sheets

INTEGRATED CIRCUIT MODELING, DESIGN, AND FABRICATION BASED ON DEGRADATION MECHANISMS

TECHNICAL FIELD OF THE INVENTION

This invention relates to integrated circuits, and more particularly to modeling, design, and fabrication of integrated circuits based on transistor degradation mechanisms.

BACKGROUND OF THE INVENTION

There are currently several known modes of transistor degradation that can adversely affect drive currents, leakage currents, and threshold voltages. One type of degradation mechanism involves channel hot carriers (CHC), which affects both N- and P-channel MOS transistor devices, in which a high electric field within a transistor causes permanent degradation of the gate dielectric by providing charge carriers with kinetic energy. Hot carriers, those with very high kinetic energy, can then generate electron-hole pairs near the drain due to impact ionization from atomic-level collisions or can be injected into the gate channel interface, breaking Si—H bonds and increasing interface trap density.

Another degradation mechanism is referred to as negative biased temperature instability (NBTI) degradation, which affects primarily P-channel MOS transistors, in which a stress voltage causes the generation of interface traps (NIT) between the gate dielectric and a semiconducting substrate. Another degradation mechanism is referred to as positive biased temperature instability (PBTI) degradation, in which a stress voltage causes the generation of bulk electron trapping in the gate dielectric. PBTI can affect both P-channel and N-channel MOS transistors, particularly hafnium-based or other similar high dielectric constant (high-K) gate stacks.

Current modeling methodology provides for modeling CHC, NBTI, and PBTI separately. That is, the amount of transistor electrical parameter degradation is typically modeled by (1) separately modeling the amount of degradation caused by each degradation mechanism and then (2) estimate a total amount of degradation by calculating the sum of these separate amounts of degradation.

SUMMARY OF THE INVENTION

This Summary is provided to comply with 37 C.F.R. §1.73, presenting a summary of the invention briefly indicating the nature and substance of the invention. It is submitted with the understanding that it will not be used to interpret or limit the scope or meaning of the claims.

In a first embodiment of the present invention, an integrated circuit (IC) is provided. The IC can include at least a first complementary MOS (CMOS) circuit comprising one or more first n-channel MOS (NMOS) transistors and one or more first p-channel MOS (PMOS) transistors. In the IC, the first NMOS transistors and the first PMOS transistors can be arranged to drive at least a first common node of the first CMOS circuit. In the IC, an average of the effective gate channel lengths of the first NMOS transistors (first NMOS average length) is at least 2% greater than an average of the effective gate channel lengths of the first PMOS transistors (first PMOS average length).

In a second embodiment, a method for modeling transistors in an integrated circuit (IC) device is provided. The method can include measuring at least one electrical characteristic of the first transistor during a stress period and updating a value of one or more device parameters in a first electrical model for the first transistor based on the measured characteristic. In the method, the first electrical model can be based on a model of the first degradation mechanism. The method can further include altering a value of the device parameters in a second electrical model for the first transistor to match the updated value, where the second electrical model can be based on a model of a second degradation mechanism.

In a third embodiment of the present invention, a method for fabricating integrated circuit devices is provided. The method can include providing a first integrated circuit including at least one first transistor designed using a plurality of design parameters, and the first IC manufactured using a plurality of process parameters. The method can also include applying stress conditions to the first transistor during a stress period to induce a first degradation mechanism in the first transistor. The method can further include measuring at least one electrical characteristic of the first transistor during the stress period obtaining an updated value for one or more device parameters in a first electrical model for the first transistor based on a first degradation mechanism and on the measured characteristic. The method also includes estimating an amount of device degradation in the first transistor during the stress period using a second electrical model for the first transistor based on a model of a second degradation mechanism and the updated value. The method can also include updating a manufacturing process for the first integrated circuit, where either process parameters or design parameters are modified based on the amount of device degradation.

DETAILED DESCRIPTION OF THE INVENTION

Figure 1A:
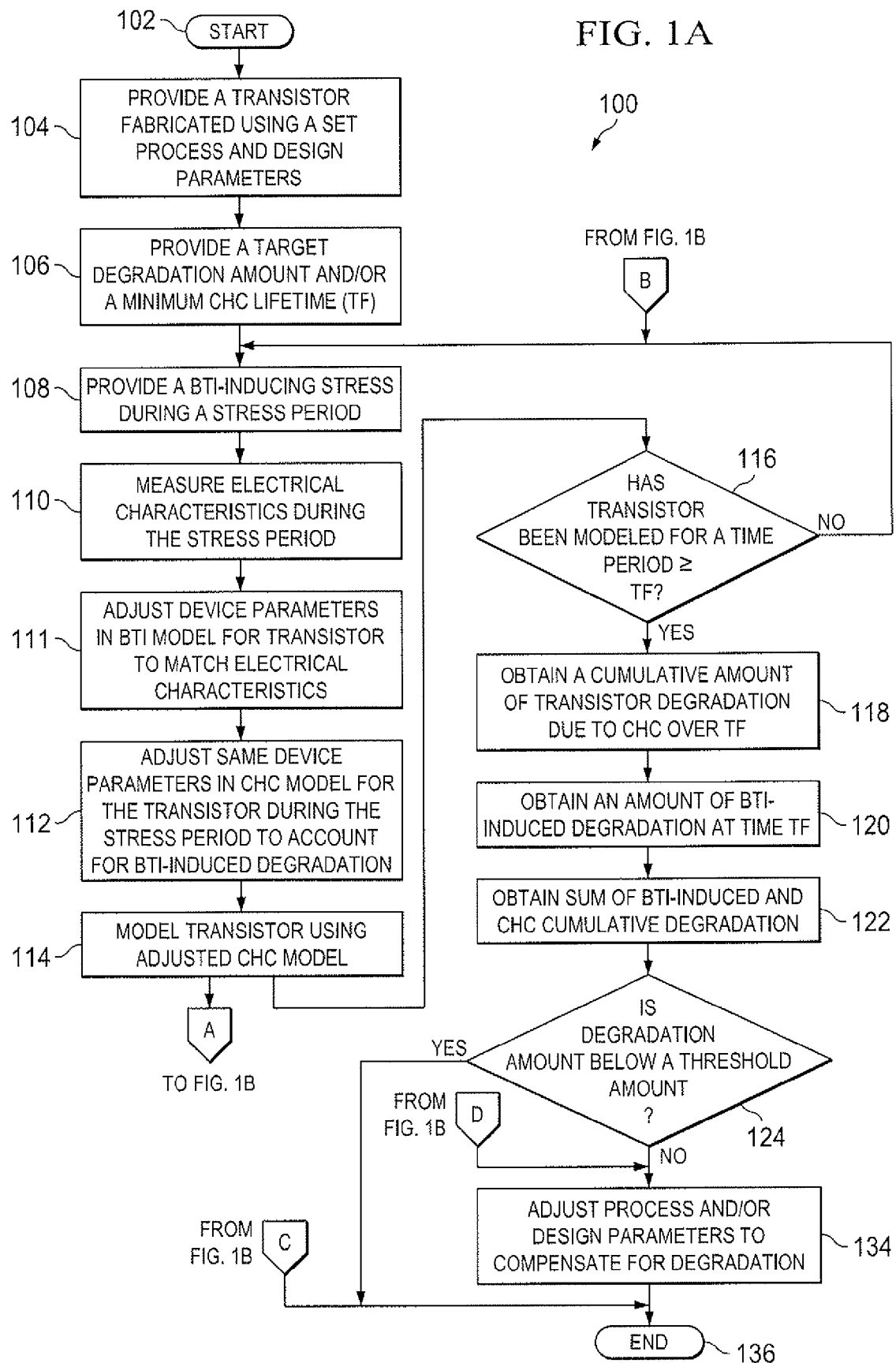
FIGS. 1A and 1B illustrate a method of adjusting an integrated circuit design to manage transistor degradation in accordance with an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention provide for modeling, design, and fabrication of an integrated circuit (IC) using transistor models that are configured to improve estimates of transistor degradation in IC. As used herein, the term "transistor" refers to metal-oxide-semiconductor (MOS) transistors, except where noted. The present Inventors have discovered that although conventional transistor models generally model the individual degradation mechanisms in a transistor with reasonable accuracy, such modeling generally fails to adjust for interactions between the different degradation mechanisms. For example, a shift in threshold voltage and transistor currents due to biased temperature instability (BTI) can affect subsequent channel hot carrier (CHC) generation. Consequently, conventional transistor models will typically fail to properly estimate the amount of CHC degradation by failing to account for such shifted parameter values in the transistor. These incorrect estimates generally result in over- or under-estimation of CHC in modeled transistors, leading to integrated circuit designs with reduced reliability or overly conservative integrated circuit designs with reduced performance and increased areas.

Accordingly, one aspect of the present invention provides for transistor modeling using improved estimation of device reliability based on modeling the interaction between two or more different transistor degradation mechanisms. For example, in some embodiments of the present invention, obtaining improved estimates CHC lifetimes can be based on adjustment of a CHC transistor model due to BTI. In some embodiments, BTI transistor modeling can be used to estimate changes in the electrical parameters of a transistor due to NBTI- and/or PBTI-inducing conditions. In other embodiments, a transistor can be subjected to NBTI- and/or PBTI-inducing conditions. However, the invention is not limited to modeling of solely interactions between BTI and CHC degradation mechanisms. In some embodiments, the methods described herein can also be used to model transistors to account for other types and/or combinations of interacting degradation mechanisms. Additionally, the invention is not solely limited to modeling of transistors. In some embodiments, the methods described here can be used for fabricating integrated circuits, including adjustment of design and process parameters.

In the case of BTI and CHC transistor degradation, the present Inventors have discovered that changes in the electrical characteristics of a transistor due to NBTI- or PBTI-inducing conditions, can then be used to refine the transistor model prior to CHC modeling. This improved CHC modeling can then be used for improving an integrated circuit design by more accurately estimating CHC lifetimes for the transistors in the design.

In particular, the present Inventors have discovered that by obtaining multiple measurements of a transistor subjected to BTI-inducing bias conditions over a period of time, these measurements can be used to adjust a BTI model for the transistor and to subsequently adjust CHC model parameters for the transistor as well. That is, any device parameter changes made for the BTI model over can be directly implemented in CHC transistor model to provide a more accurate estimate of the evolution of CHC degradation in the transistor and thus of CHIC reliability lifetimes. Based on such improved estimates of CHC device degradation, the process and design parameters for an integrated circuit can generally be more precisely adjusted when compensating for degradation or when scaling the integrated circuit design or process parameters.

Figure 1B:
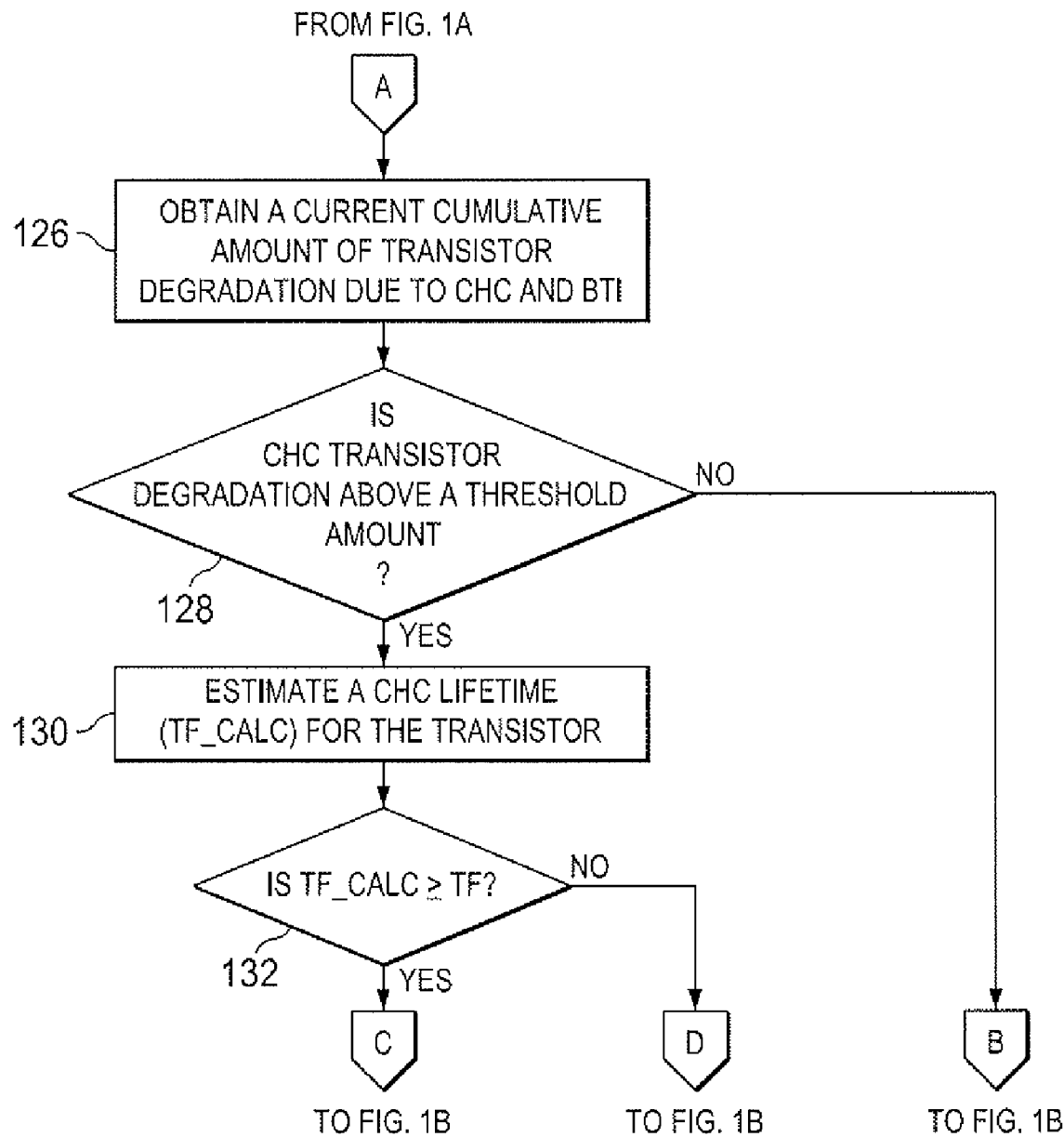

FIGS. 1A and 1B illustrates a method 100 of fabricating an integrated circuit device in accordance with an embodiment of the present invention. Referring now to FIG. 1A, the method 100 begins with step 102 and continues to step 104. In step 104, a transistor is provided that has been fabricated using a set of design and process parameters. The transistor can be selected for a particular type of BTI. For example, P-channel MOS (PMOS) transistors can be used for negative biased temperature instability (NBTI) testing. P-channel and N-channel MOS (NMOS) transistors can be also used for positive biased temperature instability (PBTI) testing. Additionally, a transistor can be selected that is relatively insensitive to CHC degradation, such as long channel transistor, for obtaining accurate measurement of electrical parameter changes that are primarily BTI-induced. Design parameters can include any layout related parameters, including but not limited to dimensions, pitch, spacing, and overlap of features. Process parameters can include any parameters or materials used for actual fabricating of the transistor, including but not limited to parameters and materials used during lithography steps, cleaning and wafer preparation steps, gate and isolation dielectric formation steps, ion implant steps, annealing steps, and metallization steps.

Subsequently, or in combination with step 104, a threshold degradation amount and/or a minimum CHC lifetime amount (TF) can be provided in step 106. In the various embodiments of the present invention, such amounts are specified by a designer, customer, or other end user. The threshold degradation amount can specify a maximum amount of degradation allowed over a predefined period of time, typically TF. In general, TF is typically 500 hrs of DC operation. This amount of time can result in threshold voltages shifts as high as 300 mV.

As previously described, the various embodiments of the present invention provide for modeling CHC degradation over one or more time periods. Accordingly, in step 108, a BTI-inducing stress can be applied to the transistor provided in step 104 during a stress period prior to measurement of BTI-induced degradation. In the various embodiments of the present invention, one or more stress periods can be provided get a reasonable and measurable degradation of the device parameters. For example, the typical length of a stress period to provide suitable BTI degradation is 50-200 s and can be repeated to provide to a total stress time of 5,000-20,000 s. Although, the stress conditions can include biasing conditions, such as a high drain to source voltage (Vds), to induce degradation, the invention is not limited in this regard. In some embodiments, stress conditions can also include increasing or decreasing a temperature of the transistor during operation or providing the biasing conditions in a non-constant manner. The type of stress can be configured based on the type of BTI degradation being induced. In the case of NBTI, the stress conditions can include applying a negative voltage stress on gate and drain of a transistor, typically 1.1 to 2.5V. In the case of PBTI, the stress conditions can include applying a positive voltage stress on gate and drain of a transistor, typically between 1.1 to 2.5V.

Once the BTI-inducing stress is applied in step 108, the transistor electrical characteristic can be measured in step 110. In particular, the change in electrical characteristics from an initial value can be measured. Although a variety of electrical characteristics of the transistor can be measured, common BTI-sensitive electrical characteristics include threshold voltage (Vt), drain saturation current (Idsat), and substrate current (Isub). An exemplary set of data showing such shifts is shown in FIG. 2.

Figure 2:
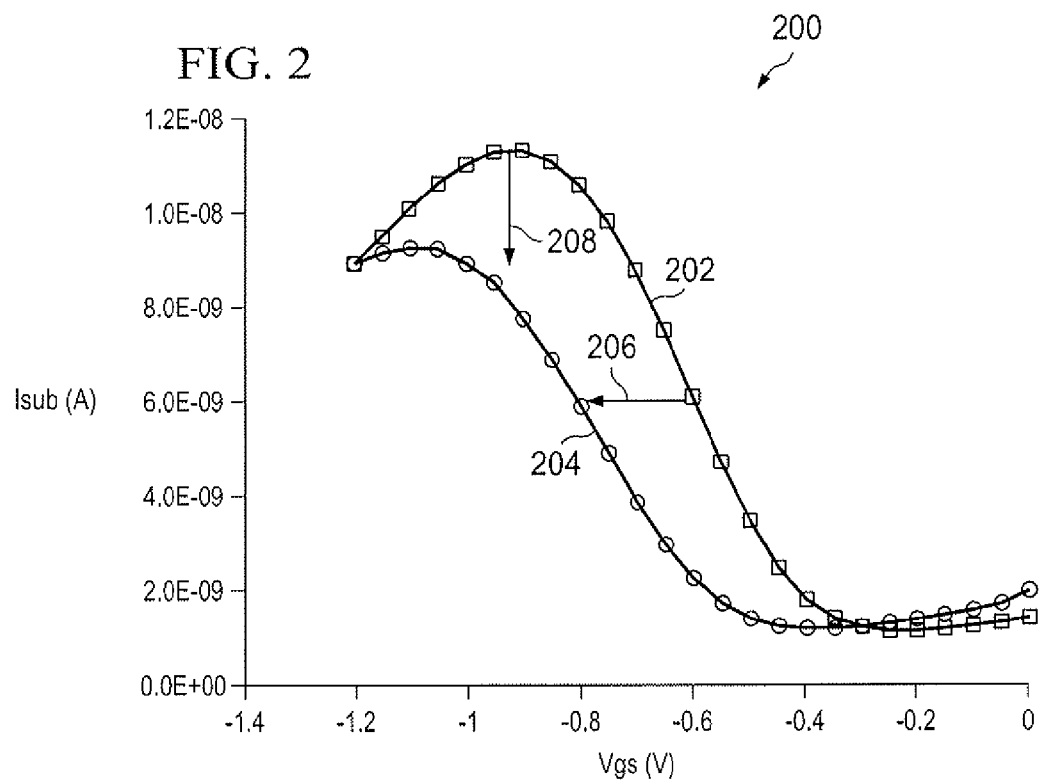
FIG. 2 is an exemplary plot showing the shifts in threshold voltage and substrate current as a function of NBTI stress conditions applied, according to an embodiment of the present invention.

FIG. 2 is a plot 200 of Isub versus gate to source voltage (Vgs) in a PMOS transistor before and after inducing NBTI stress conditions in accordance with an embodiment of the present invention. For the data collected in FIG. 2, the source and body of the transistor were grounded and the drain was baised to −1.8V. As shown in FIG. 2, two curves, 202 and 204, are shown, illustrating a typical Isub vs. Vgs curve before and after NBTI stress conditions, respectively. In FIG. 2, the shift in Vt is shown by the lateral shift 206 between curves 202 and 204. In particular, the additional trapped positive charges in the gate dielectric produce a more negative Vt in the PMOS transistor. For example, as shown in curve 202, prior to NBTI stress, Isub=6 nA and Vt=−0.6V. However after NBTI stress, for Isub=6 nA and Vt=−0.8V, a 200 mV change. FIG. 2 also illustrates how Idsat is altered as well. For example, one of ordinary skill in the art will recognize that as Isub is decreased, Idsat is increased and vice versa. In FIG. 2, the shift in Isub (Idsat) is shown by the downward shift 208 between the peak Isub in curve 202 (~11 nA) and the peak Isub in curve 204 (~9 nA). Accordingly, step 110 can include obtaining Vt, Idsat, and Isub before and after a high field is applied between the source and the drain. That is, when the source-drain voltage (Vds) is greater than Vt. In some embodiments, measurements can be taken when Vds>>Vt, such as −1.1V, −1.8V, or −2.5V. A similar magnitude of stress can be applied in the case of PBTI.

Referring back to FIG. 1A, once the measurements are obtained in step 110, the measurements can be used to adjust a CHC model for the transistor during the stress period. One of ordinary skill in the art will recognize that when a transistor is placed under DC stress, the dominant degradation mechanism can change over time. Initially, degradation is generally dominated by reversible BTI-induced degradation. This typically occurs during time periods of less than ~1,000 seconds. However, as DC stress is continued, the field established between the source and drain can become sufficiently large to provide carriers with sufficient kinetic energy (hot carriers) to cause permanent degradation as a result of collisions in the channel, the source/drains, or the gate dielectric. Therefore, the present Inventors have discovered that if BTI degradation can be accurately modeled, the changes in electrical characteristics observed during BTI-stressing can be used to model CHC degradation more accurately.

Accordingly, in step 111, the BTI model can be adjusted to match or approximate (within 0.1%-0.5%, as defined by tolerance level for the IC) the electrical characteristics obtained in step 110. That is, one or more of the device parameters in the BTI model can be adjusted until the output of the BTI model and the device measurements in step 110 match or are sufficiently close. That is, an $R^2$ fit value of 80% or better. Afterwards, in step 112, the CHC model is adjusted to reflect the same changes in device parameters. Such adjustments to the BTI and CHC models and subsequent simulation of transistor can be performed using various types of modeling and/or simulation tools. For example, the modeling and simulation tool RELXPERT by Celestry Design Technologies, Inc. is one suitable modeling and simulation tool.

Once the CHC degradation during a stress period has been modeled using the adjusted CHC degradation model in step 114, the results can be used to adjust an integrated circuit design or to adjust a manufacturing process for the integrated circuit design. In some embodiments of the present invention, the improved CHC degradation modeling can be used to determine whether a current design and process exceeds an allowable amount of degradation for a specified time period (TF). (Steps 116-124.)

In step 116, a determination can be made as to whether sufficient modeling of the CHC degradation has occurred. That is, a determination can be made as to whether the length of the stress periods modeled for CHC degradation meets or exceeds TF. If insufficient modeling is found in step 116, steps 108-114 are repeated for additional time periods. Once sufficient modeling is found in step 116, a total amount of CHC degradation during TF is determined in step 118. That is, a cumulative amount of degradation for the modeled stress periods is determined. For example, in the case of Idsat, this can be expressed as:

$$\Delta Idsat_{CHC\_total}(TF) = \sum_{i=0}^{TF} \Delta Idsat_{CHC}(t),$$

where $$\Delta Idsat_{CHC}(t) = f[\Delta Isub_{BTI}(t), \Delta Vt_{BTI}(t), \Delta Idsat_{BTI}(t)]$$

However, the invention is not limited in this regard. In other embodiments, a similar approach can be developed for modeling the linear drain current (Idlin) or the current at ½ of Vd for Idsat (Idmid).

Subsequently or in combination with step 118, the amount of BTI device degradation at TF can also be determined in step 120. This amount of degradation can be obtained from actual data or can be extrapolated from measured device data, as previously described. Afterwards a total amount of degradation can be determined by obtaining the sum of the amounts calculated in steps 118 and 120. For example, in the case of Idsat:

$$\Delta Idsat_{total}(TF) = \Delta Idsat_{CHC\_total}(TF) + \Delta Idsat_{BTI}(TF)]$$

As all of electrical parameters generally evolve and degradation similarly, the degradation of Vt, Isub, or other electrical parameters of interest can be modeled similarly as Idsat.

After the total amount of device degradation is computed in step 122, in step 124, a determination can be made as to whether the degradation is below a threshold amount. For example, such a threshold amount can be between 3% and 10% of an initial Idsat. If the degradation is below a threshold amount in step 124, the integrated circuit device design and/or process is acceptable and the method 100 can end in step 136. However, if the degradation is not below a threshold amount in step 124, adjustment of the process or design parameters can be performed in step 134 and the method can end in step 136. In some embodiments, if degradation is not above a threshold amount, the design and/or process parameters can be scaled more aggressively to improve transistor performance. In other embodiments, if degradation is above the threshold amount, the design and/or process parameters can be adjusted to reduce degradation.

In the various embodiments of the present invention any number and combination of design and process parameters can be adjusted to improve transistor performance and/or adjust the amount of degradation. For example, in the case of BTI and CHC degradation, these adjustments can include changes in the effective gate channel length of the transistor by adjusting the physical length of the gate dielectric in the transistor and/or adjusting a dose, energy, or angle in one or more implants. Changes in implants can include, but are not limited to changes in source drain implants, lightly doped drain (LDD) implants, and halo implants. However, the invention is not limited in this regard and various other design and/or process parameters can be changed. Once a new transistor is available with the improved process and/or design parameters, the method 100 can be repeated if necessary.

In other embodiments of the present invention, the improved CHC degradation modeling can be used to determine whether a current design and process exceeds or meets at least a minimum lifetime (TF) requirement. (Steps 126-132). That is, the method 100 can determine the length of time required to reach a threshold degradation amount. Accordingly, after the transistor is modeled in step 114 using the adjusted CHC model, as previously described, the cumulative amount of degradation (CHC and BTI) can be obtained in step 126, as shown in FIG. 1B. This amount can be calculated as previously described in steps 118-122 in FIG. 1A. However, rather than calculating for a pre-determined lifetime (TF), the sum can be calculated for only the modeled stress periods. Afterwards, in step 128, the sum can be compared to a threshold amount. If the sum is less than the threshold amount in step 128, steps 108-126 in FIGS. 1A and 1B can be repeated. If the sum is greater than or equal to the threshold amount in step 128, the lifetime for the integrated circuit device can be estimated in step 130. That is, the sum (TF_CALC) of the lengths of each of the stress periods required to reach the threshold degradation level is obtained.

Afterwards, in step 132, TF_CALC can be compared to a pre-determined minimum lifetime (TF). Accordingly, if TF_CALC is greater than or equal to TF in step 132, the integrated circuit device can be determined to have sufficient lifetime and the method 100 can end in step 136 in FIG. 1A. However, if TF_CALC is less than TF in step 132, the integrated circuit device can be determined to have an insufficient lifetime. Therefore, in the case of insufficient lifetime, the process or design parameters can be adjusted, as shown in FIG. 1A, in step 134 and the method can end in step 136. Once a new transistor is available with the improved process and/or design parameters, the method 100 can be repeated.

As previously described, the various embodiments of the present invention allow improved estimation of CHC degradation in an integrated circuit device. In particular, the present Inventors have discovered that CHC degradation is typically over-estimated in conventional degradation modeling as compared to modeling using the various embodiments of the present invention. This is conceptually illustrated in FIG. 3.

Figure 3:
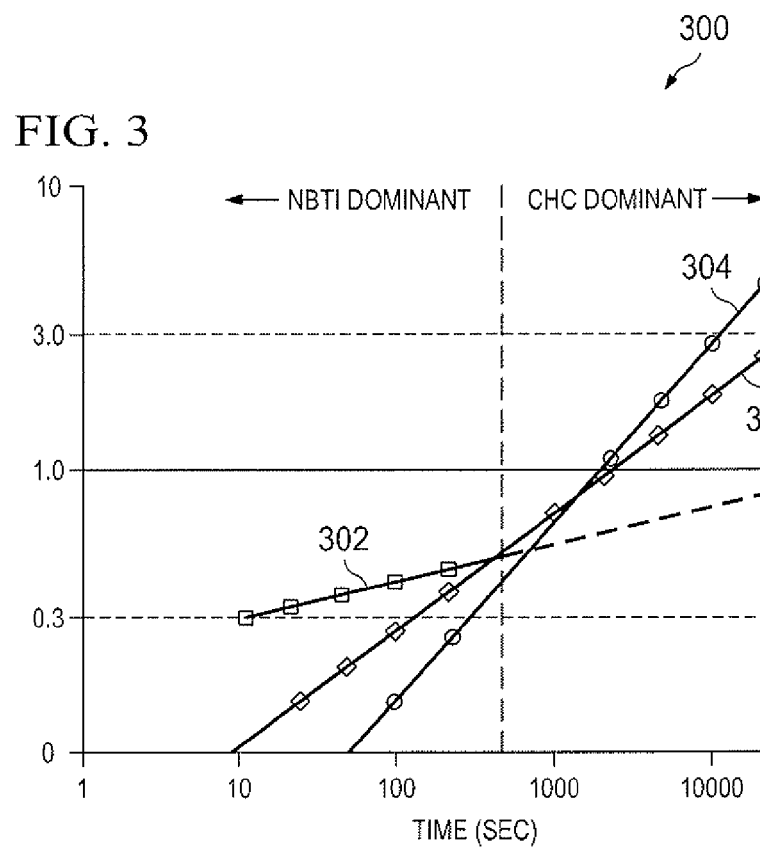
FIG. 3 is an exemplary plot showing % change in Idsat as a function of time for a NBTI transistor model, a conventional CHC transistor model, and a CHC transistor model configured according to an embodiment of the present invention.

FIG. 3 shows a log-log plot 300 of the % change in Idsat (ΔIdsat) over time for a P-channel transistor modeled using conventional transistor degradation modeling (304) and transistor degradation modeling according to an embodiment of the present invention 306. For the data in FIG. 3, the drain of the transistor was biased to −2V and the gate was biased to −1.6V. As shown in FIG. 3, for the time period below ~500 second, NBTI is dominant, as shown by curve 302. Above 500 seconds, CHC degradation begins to become dominant, as shown by the difference between curve 302 and curves 304 and 306, corresponding to conventional CHC modeling and CHC modeling according to an embodiment of the present invention, respectively. As shown in FIG. 3, conventional CHC modeling curve shows a higher amount of CHC degradation in Idsat than adjusted CHC modeling curve 306. The difference in amounts of CHC transistor degradation in curve 306 as compared to curve 304 is a direct result of incorporating BTI-induced transistor characteristics into the CHC model. That is, by adjusting device parameters of the transistor model, changes in the electrical parameters can be accounted in the adjusted CHC model.

As a result, in the case of NBTI, a lower amount of CHC degradation can be estimated based on a CHC model adjusted for NBTI. A similar effect can result from PBTI effects on device parameters. Accordingly, using the adjusted CHC model, degradation in NMOS and PMOS devices can be more accurately modeled. For example, as shown in curves 304 and 306, CHC degradation of Idsat reaches ~3% at ~12,000 and ~65,000 seconds respectively. Thus, at a 3% Idsat degradation limit, conventional CHC modeling would result in underestimating CHC lifetimes five-fold, leading the circuit designer to conclude that a more conservative design would be required. However, by applying CHC modeling according to the various embodiments of the present invention, the design and process parameters can be more aggressively scaled without resulting in reliability failures due to CHC induced degradation. This is illustrated with respect to FIGS. 4, 5A, and 5B.

Figure 4:
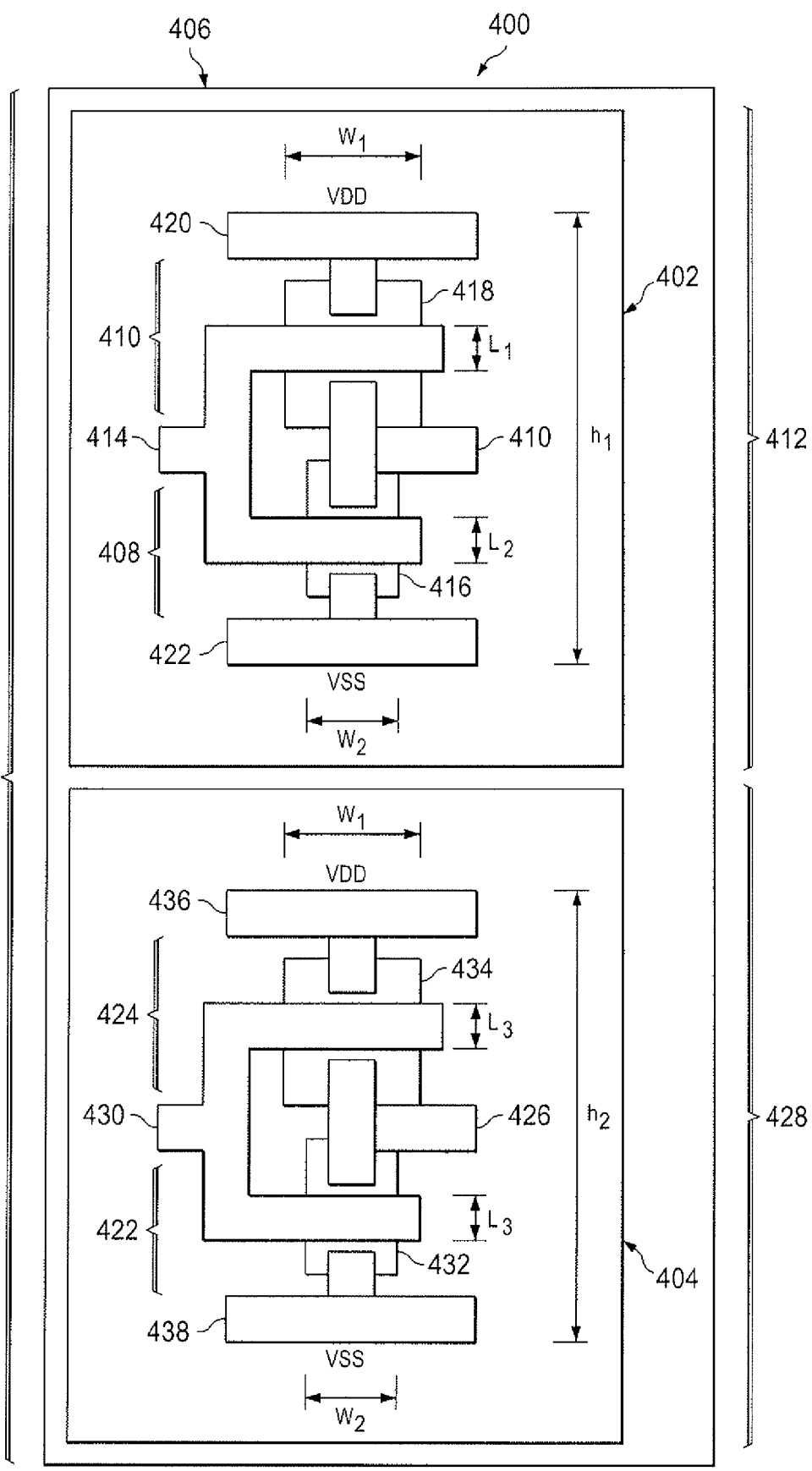
FIG. 4 shows an IC including a first complementary MOS (CMOS) circuit formed on a semiconductor substrate according to an embodiment of the present invention.

FIG. 4 shows an IC 400 including a first complementary MOS (CMOS) circuit 402 formed on a semiconductor substrate 406 according to an embodiment of the present invention. The first CMOS circuit 402 can include at least one NMOS transistor 408 and at least one PMOS transistor 410. In the exemplary IC in FIG. 4, the NMOS transistor 408 and the PMOS transistor 410 are coupled together to drive a voltage of at least one common node 410 in the first CMOS circuit. In particular, as shown in FIG. 4, the transistors 408 and 410 are arranged to form an inverter 412 having a common gate portion 414 coupled to an NMOS gate portion 416 and a PMOS gate portion 418. The inverter 412 can also be coupled to a VDD supply line 420 and a VSS supply line 422. However, the invention is not limited in this regard and other arrangements and/or layouts of NMOS and PMOS transistors can be used. Such arrangements can include any combination of NMOS and PMOS transistors, including arrangements of solely NMOS or solely PMOS transistors.

In conventional CMOS circuits, the NMOS and PMOS transistor gates are typically dimensioned to provide matching transistors in terms of Vt, Idsat, and other parameters. In general, such matching is based on adjustment of the width of the gates and the implants used in the transistor rather than adjustment of the gates lengths. As a result, the gate channel length in CMOS circuit logic, both physical and electrical, is kept constant. That is, the percent difference in the average value of the gate channel lengths of PMOS transistors in the circuit and NMOS transistors in the circuit is less than 2% for advanced technologies.

As previously described, the various embodiments of the present invention provided an adjusted CHC model in which the amount of degradation is reduced as compared to conventional CHC models. Accordingly, since the adjusted CHC model predicts that the amount of degradation is reduced in a given transistor, circuit designers can use the additional margin provided by the reduced degradation to adjust transistor design by reducing gate channel lengths, electrical and/or physical, for PMOS transistors or both the PMOS and NMOS transistors. This is illustrated by the modeled data in FIGS. 5A and 5B.

Figure 5A:
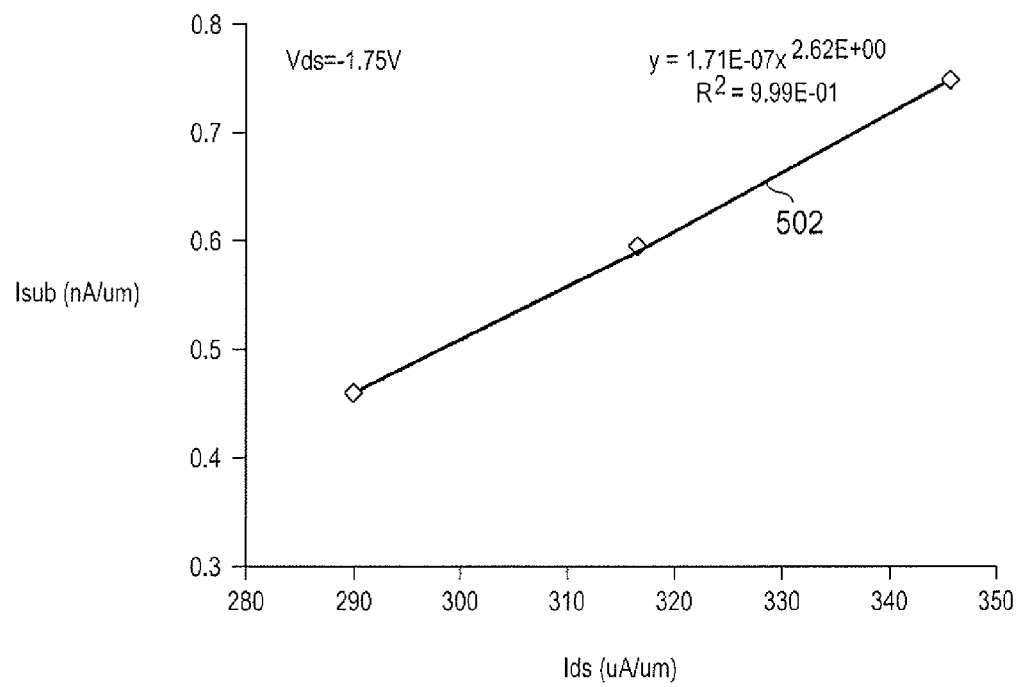
FIG. 5A shows a plot of modeled Ids versus Isub for PMOS transistors biased with Vds=−1.75V, where the modeled values are obtained from transistor model adjusted according an embodiment of the present invention.

FIG. 5A shows a plot of modeled Ids versus Isub for PMOS transistors biased with Vds=−1.75V after 500 hours, where the modeled values are obtained from transistor model adjusted according an embodiment of the present invention. In FIG. 5A, PMOS transistors having ~0.14 um, ~1.2 um, and ~0.95 um gate channel lengths are used and show that for a typical 10% degradation in Ids after 500 hours due to NBTI, the trend 502 indicates that Isub degrades ~20%. That is, over the length of curve 502, Ids varies from ~346 uA/um to ~290 uA/um, a ~16% degradation. At the same time, Isub varies from ~0.75 nA/um to ~0.47 nA/um, a ~37% degradation and twice that of Ids.

Figure 5B:
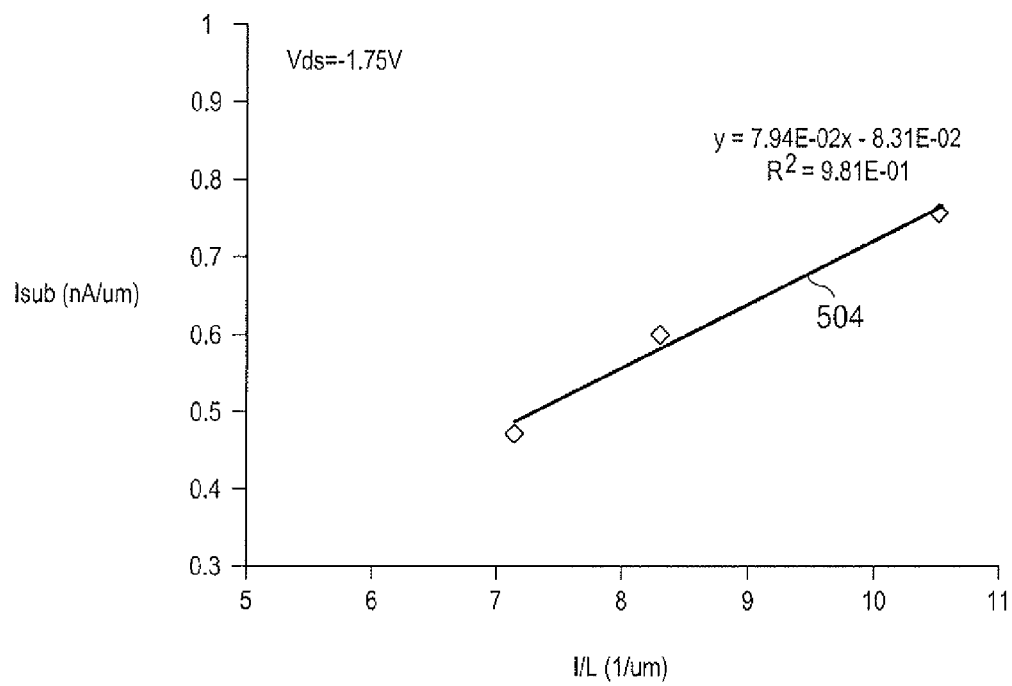
FIG. 5B shows a plot of modeled Ids versus 1/L (L=gate channel length) for PMOS transistors biased with Vds=−1.75V, where the modeled values are obtained from transistor model adjusted according an embodiment of the present invention.

Accordingly for a 10% degradation in Ids, Isub will degrade at least twice as much, or 20%. At the same time FIG. 5B shows a plot of modeled 1/L (L=gate channel length) versus Isub using for a PMOS transistors biased with Vds=−1.75V, where the modeled values are obtained from a transistor model adjusted according an embodiment of the present invention. As shown in FIG. 5B, for PMOS transistors having ~0.14 um, ~1.2 um, and ~0.95 um gate channel lengths, Isub varies approximately linearly with 1/L. Therefore, if a maximum of 10% degradation in Ids is allowed for the PMOS transistor, which translates to a 20% degradation in Isub in FIG. 5A, this translates to a maximum Isub in FIGS. 5A and 5B of ~0.9 nA/um (1.2×0.75 nA/um for L=0.095 um). Accordingly, it is possible to select a smaller gate channel length than 0.095 um and still have an acceptable post-degradation Isub value. For example, a reduction of gate channel length of ~4%, resulting in a ~0.091 um PMOS gate channel length, corresponds to a 1/L value of ~11 and a Isub value of ~0.8 nA/um in curve 504.

Therefore, PMOS gate channel lengths can be adjusted to by 2%, 4%, or even 10% smaller than the as-designed gate PMOS transistor. A similar trend follows in the case of NMOS due to PBTI, also the amount of change is more limited, typically between 2% and 4%. Thus the adjusted CHC model provides for adjusting the PMOS gate channel length L1 for PMOS transistor 410 relative to NMOS gate channel length L2 for NMOS transistor 408 such that L2 is at least 2%, 4%, or 10% smaller than L1, based on the amount of NBTI and PBTI degradation. Alternatively, the transistor can be operated at a higher source drain bias since modeling shows that transistor can sustain CHC damage for a longer time prior to unacceptable degradation. Thus, in circuits more susceptible to BTI, the difference will be greater than for those susceptible to NBTI and PBTI. Such changes in gate channel length or higher drain bias allow the transistors to operate at higher speeds by increasing Ids without significant concern for degradation affecting reliability. Furthermore, such decreases in dimensions allow greater packing density by allowing the reduction of spacing between contacts in the transistors, active areas, and other portions of the transistors.

Although FIG. 4 is described in terms of adjusting the physical gate channel lengths, the invention is not limited in this regard. In some embodiments, rather than producing one or more new masks to generate the differences in gate channel length by adjusting the gate channel length, changes in effective gate channel length can be implemented by adjusting one or more implants, albeit with no reduction in transistor size. However, improved performance is still provided by the reduced effective gate channel lengths.

Although the various embodiments of the present invention can be used for adjusting design and/or process parameters for all transistors on an integrated circuit, in other embodiments, adjustments based on the adjusted CL-IC model can be applied selectively. Such selectivity can be applied when circuits not requiring high performance, but increase stability are included in an IC. For example, CMOS digital circuits, CMOS digital signal processing circuits, digital amplifier circuits, radio frequency (RF) CMOS circuits can all be scaled to improve performance of the IC. However, circuits such as CMOS memory circuits, analog amplifier circuits, analog to digital (A/D) converter circuits, digital to analog (D/A) converter circuits, and analog controller circuits, can require stability in the device and typically require more conservative scaling. Accordingly, different scaling can be provided in different areas of the IC. This is also illustrated in FIG. 4.

In FIG. 4, the IC 400 shown also includes a second CMOS circuit 404. As shown in FIG. 4, the second CMOS circuit 404 can include at least one NMOS transistor 422 and at least one PMOS transistor 424. In the exemplary IC in FIG. 4, the NMOS transistor 422 and the PMOS transistor 424 are coupled together to drive a voltage of at least one common node 426 in the second CMOS circuit 404. In particular, as shown in FIG. 4, the transistors 422 and 424 are arranged to form an inverter 428 having a common gate portion 430 coupled to an NMOS gate portion 432 and a PMOS gate portion 434. The inverter 430 can also be coupled to a VDD supply line 436 and a VSS supply line 438. However, the invention is not limited in this regard and other arrangements and/or layouts of NMOS and PMOS transistors can be used. Such arrangements can include any combination of NMOS and PMOS transistors, including arrangements of solely NMOS or solely PMOS transistors.

As shown in FIG. 4, the NMOS and PMOS transistor second CMOS circuit can be unadjusted. That is, the percent difference the gate channel length (L3) of NMOS transistor 422 and PMOS transistor 424 can be less than 2%, where L3≧L2 and L3≧L1. Also as shown in FIG. 4, the gate channel widths W1 and W2 for the PMOS and NMOS transistors can be the same in the first CMOS circuit 402 and the second CMOS circuit 404. That is, the average percent difference between the gate channel widths (physical or effective) for PMOS transistors 410 and 424 can be less than 2% and the average percent different between the gate channel widths (physical or effective) for NMOS transistors 408 and 422 can also be less than 2%. The changes in L1 and L2 relative to L3 result in a decreased size of the first CMOS circuit 402 relative to the second CMOS circuit 404. For example, as shown in FIG. 4, the differences in L1 and L2 relative to L3 result in a height (h1) of inverter 412 less than a height (h2) of inverter 428. The difference in dimensions, although small for individual transistors, can translate to a large space savings on the IC. For example, in portions of the first CMOS circuit 402 including a large number of PMOS devices in proximity, such as in boolean gates or PMOS cascode amplifiers, the reduction in PMOS physical gate channel length reduces the area required for the device. A similar effect can be seen in portions of the first CMOS circuit 402 including a large number of NMOS devices in proximity, such as boolean gates or NMOS cascode amplifiers. However, the invention is not limited in this regard and the IC can include other types of circuit designs which can be adjusted to increase packing density in the IC.

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit (IC), comprising:
  at least a first complementary MOS (CMOS) circuit, said first CMOS circuit comprising one or more first n-channel MOS (NMOS) transistors and one or more first p-channel MOS (PMOS) transistors,
  wherein said first NMOS transistors and said first PMOS transistors are arranged in said first CMOS circuit to drive at least a first common node of said first CMOS circuit, and wherein an average of said effective gate channel lengths of said first NMOS transistors (first NMOS average length) is at least 2% greater than an average of said effective gate channel lengths of said first PMOS transistors (first PMOS average length).

2. The IC of claim 1, wherein said difference is greater than 4%.

3. The IC of claim 1, wherein said difference is greater than 10%.

4. The IC of claim 1, further comprising at least a second CMOS circuit, said second CMOS circuit comprising one or more second NMOS transistors and one or more second PMOS transistors,
  wherein said second NMOS transistors and said second PMOS transistors are arranged in said second CMOS circuit to drive at least a second common node of said second CMOS circuit, and wherein a percent difference between an average of said effective gate channel lengths of said second NMOS transistors (second PMOS average length) and an average of said effective gate channel lengths of said second NMOS transistors (second NMOS average length) is less than 2%.

5. The IC of claim 4, wherein a percent difference between an average of said gate channel widths of said first NMOS transistors (first NMOS average width) and an average of said gate channel widths of said second NMOS transistors (second NMOS average width) is less than 2%, and wherein a percent difference between an average of said gate channel widths of said first PMOS transistors (first PMOS average width) and an average of said gate channel widths of said second PMOS transistors (second PMOS average width) is less than 2%.

6. The IC of claim 4, wherein said first CMOS circuit comprises at least one among a CMOS digital logic circuit, a CMOS digital signal processing circuit, a digital amplifier circuit, and a radio frequency (RF) CMOS circuit.

7. The IC of claim 4, wherein said second CMOS circuit comprises at least one among a CMOS memory circuit, an analog amplifier circuit, an analog to digital (A/D) converter circuit, a digital to analog (D/A) converter circuit, and an analog controller circuit.

8. A method for modeling transistors in an integrated circuit (IC) device comprising a first MOS transistor, the method comprising:
  applying stress conditions to said first MOS transistor during a stress period, said stress conditions selected to induce a first device degradation mechanism in said first MOS transistor;
  obtaining at least one measured electrical characteristic of said first MOS transistor during said stress period;
  determining an updated value for one or more device parameters in a first electrical model for said first MOS transistor based on said measured characteristic, said first electrical model based on a model of said first device degradation mechanism, and said updated value selected to cause said first electrical model to reflect said measured characteristic under said stress conditions; and
  ascertaining an altered value for at least one of said device parameters in a second electrical model for said first MOS transistor to match said updated value, said second electrical model based on a model of a second device degradation mechanism.

9. The method of claim 8, further comprising calculating an estimated amount of device degradation attributable to said second device degradation mechanism in said first MOS transistor said stress period based on said second electrical model using said altered value.

10. The method of claim 9, wherein a length of said stress period is less than a pre-defined lifetime for said second device degradation mechanism, and wherein the method further comprises:
  repeating said applying, said obtaining, said determining, said ascertaining, and said calculating for one or more additional stress periods until a sum of said stress period and said additional stress periods is greater than or equal to a pre-defined lifetime for said second device degradation mechanism.

11. The method of claim 10, further comprising calculating a total amount of said device degradation during said pre-defined lifetime, said calculating comprising:
  computing a total amount of said device degradation attributable to said second device degradation mechanism, said total amount equal to a sum of said estimated amount of said device degradation attributable to said second device degradation mechanism during said stress period and said additional stress periods;

computing an additional amount of device degradation attributable to said first device degradation mechanism at said pre-defined lifetime based on said first electrical model;

obtaining a sum of said total amount and said additional amount.

12. The method of claim 9, further comprising:

if said estimated amount of said device degradation attributable to said second degradation mechanism is less than a threshold degradation level, repeating said applying, said obtaining, said determining, said ascertaining, and said calculating for one or more additional stress periods until a cumulative amount of said device degradation attributable to said second device degradation mechanism is greater than or equal to said threshold degradation level, wherein said cumulative amount comprises a sum of said estimated amount of said device degradation attributable to said second degradation mechanism during said stress period and said additional stress periods.

13. The method of claim 12, further comprising calculating a reliability lifetime for said first MOS transistor, said calculating comprising extrapolating said reliability lifetime based on said estimated amount of said device degradation attributable to said second device degradation mechanism during each of said stress periods, a length of each of said stress periods, and said threshold degradation level.

14. The method of claim 8, wherein said first device degradation mechanism comprises negative bias temperature instability NBTI) degradation or positive bias temperature instability (PBTI) degradation, and wherein said second device degradation mechanism comprises channel hot carrier (CHC) degradation.

15. The method of claim 14, further comprising applying heat to said first MOS transistor during said stress period.

16. The method of claim 14, wherein said electrical parameters comprise a drain saturation current and a substrate current of said first MOS transistor.

17. The method of claim 8, wherein said stress conditions are constant during said stress period.

18. A method for fabricating integrated circuit devices, the method comprising:

providing a first integrated circuit (IC) including at least a first MOS transistor, said IC designed using a plurality of design parameters, said first IC fabricated using a plurality of process parameters;

applying stress conditions to said first MOS transistor during a stress period, said stress conditions selected to induce a first device degradation mechanism in said first MOS transistor;

obtaining at least one measured electrical characteristic of said first MOS transistor during said stress period;

determining an updated value for one or more device parameters in a first electrical model for said first MOS transistor based on said measured characteristic, said first electrical model based on a model of said first device degradation mechanism, and said updated value selected to cause said first electrical model to reflect said measured characteristic under said stress conditions;

ascertaining an altered value for at least one of said device parameters in a second electrical model for said first MOS transistor to match said updated value, said second electrical model based on a model of a second device degradation mechanism;

evaluating a predicted amount of device degradation in said first MOS transistor after applying said update value to said first electrical model and said altered value to said second electrical model; and identifying at least among said plurality of design parameters and said plurality of process parameters to modify based on said predicted amount of device degradation.

19. The method of claim 18, said evaluating further comprising calculating an estimated amount of device degradation attributable to said second device degradation mechanism in said first MOS transistor said stress period based on said second electrical model using said altered value.

20. The method of claim 19, wherein a length of said stress period is less than a pre-defined lifetime for a second device degradation mechanism, and wherein the method further comprises:

repeating said applying, said obtaining, said determining, said ascertaining, and said evaluating for one or more additional stress periods until a sum of said stress period and said additional stress periods is greater than or equal to said pre-defined lifetime for said second device degradation mechanism.

21. The method of claim 20, said evaluating further comprising calculating a total amount of said device degradation during said pre-defined lifetime, said calculating comprising:

computing a total amount of device degradation attributable to said second device degradation mechanism, said total amount equal to a sum of said estimated amount of said device degradation attributable to said second device degradation mechanism during said stress period and said additional stress periods;

computing an additional amount of device degradation attributable to said first device degradation mechanism at said pre-defined lifetime based on a said first electrical model;

obtaining a sum of said total amount and said additional amount.

22. The method of claim 19, said evaluating further comprising:

if said estimated amount of said device degradation attributable to said second degradation mechanism is less a threshold degradation level, repeating said applying, said obtaining, said determining, said ascertaining, and said calculating for one or more additional stress periods until a cumulative amount of said device degradation attributable to said second device degradation mechanism is greater than or equal to said threshold degradation level, wherein said cumulative amount comprises a sum of said estimated amount of said device degradation attributable to said second degradation mechanism during said stress period and said additional stress periods.

23. The method of claim 22, said evaluating further comprising calculating a reliability lifetime for said transistor, said calculating comprising extrapolating said reliability lifetime based on said estimated amount of said device degradation attributable to said second device degradation mechanism during each of said stress periods, a length of each of said stress periods, and said threshold degradation level.

24. The method of claim 18, wherein said first device degradation mechanism comprises negative bias temperature instability (NBTI) degradation or positive bias temperature instability (PBTI) degradation, and wherein said second device degradation mechanism comprises channel hot carrier (CHC) degradation.

25. The method of claim 24, further comprising applying heat to said first transistor during said stress period.

26. The method of claim 24, wherein said electrical parameters comprise a drain saturation current and a substrate current of said first transistor.

27. An integrated circuit (IC), comprising:
at least a first complementary MOS (CMOS) circuit, said first CMOS circuit comprising one or more first n-channel MOS (NMOS) transistors and one or more first p-channel MOS (PMOS) transistors,
at least a second CMOS circuit, said second CMOS circuit comprising one or more second n-channel MOS (NMOS) transistors and one or more second p-channel MOS (PMOS) transistors,
wherein said first NMOS transistors and said first PMOS transistors are arranged in first CMOS logic to drive at least a first common node of said first CMOS logic, and wherein a percent difference between an average of said effective gate channel lengths of said first NMOS transistors (first NMOS average length) and an average of said effective gate channel lengths of said first PMOS transistors (first PMOS average length) is greater than 2%, and
wherein said second NMOS transistors and said second PMOS transistors are arranged in said second CMOS logic to drive at least a second common node of said second CMOS logic, and wherein a percent difference between an average of said effective gate channel lengths of said second NMOS transistors (second PMOS average length) and an average of said effective gate channel lengths of said second NMOS transistors (second NMOS average length) is less than or equal to 2%.

28. The method of claim 27, wherein said stress conditions are constant during said stress period.

29. The IC of claim 27, wherein said first CMOS circuit comprises at least one among a CMOS digital logic circuit, a CMOS digital signal processing circuit, a digital amplifier circuit, and a radio frequency (RF) CMOS circuit.

30. The IC of claim 27, wherein said second CMOS circuit comprises at least one among a CMOS memory circuit, an analog amplifier circuit, an analog to digital (A/D) converter circuit, a digital to analog (D/A) converter circuit, and an analog controller circuit.

* * * * *